(12) United States Patent
Abe

(10) Patent No.: US 8,045,026 B2
(45) Date of Patent: Oct. 25, 2011

(54) SOLID-STATE IMAGE SENSING DEVICE

(75) Inventor: Junichi Abe, Kitakami (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 697 days.

(21) Appl. No.: 12/061,300

(22) Filed: Apr. 2, 2008

(65) Prior Publication Data

US 2008/0246868 A1  Oct. 9, 2008

(30) Foreign Application Priority Data

Apr. 5, 2007  (JP) .................................. 2007-099349

(51) Int. Cl.
| | |
|---|---|
| H04N 3/14 | (2006.01) |
| H04N 5/225 | (2006.01) |
| H01L 27/00 | (2006.01) |
| H01L 31/062 | (2006.01) |
| G02B 7/28 | (2006.01) |

(52) U.S. Cl. ..................... 348/294; 348/340; 250/208.1; 257/291; 257/292; 396/114

(58) Field of Classification Search .................. 348/294, 348/340; 257/291–292; 396/114; 438/25–26; 250/208.1

See application file for complete search history.

(56) References Cited

U.S. PATENT DOCUMENTS

| | | | |
|---|---|---|---|
| 6,686,588 B1 * | 2/2004 | Webster et al. ............... 250/239 |
| 7,005,310 B2 | 2/2006 | Hanada et al. | |
| 2004/0027477 A1 | 2/2004 | Tamura et al. | |
| 2004/0056971 A1 | 3/2004 | Yang et al. | |
| 2005/0048692 A1 * | 3/2005 | Hanada et al. ................ 438/106 |
| 2006/0126194 A1 * | 6/2006 | Kazama ........................ 359/811 |
| 2006/0220025 A1 * | 10/2006 | Oh ................................... 257/72 |
| 2007/0013068 A1 * | 1/2007 | Ranade et al. ................ 257/738 |
| 2007/0145569 A1 | 6/2007 | Hsin | |

FOREIGN PATENT DOCUMENTS

| | | |
|---|---|---|
| JP | 4-235475 | 8/1992 |
| JP | 11-17997 | 1/1999 |
| JP | 2005-244118 | 9/2005 |
| JP | 2006-19837 | 1/2006 |
| JP | 2006-173855 | 6/2006 |

OTHER PUBLICATIONS

Office Action mailed on Oct. 5, 2010, in Japanese Patent Application No. 2007-099349 (with Partial English Translation).

* cited by examiner

*Primary Examiner* — Lin Ye
*Assistant Examiner* — Mekonnen Dagnew
(74) *Attorney, Agent, or Firm* — Oblon, Spivak, McClelland, Maier & Neustadt, L.L.P.

(57) ABSTRACT

In a solid-state image sensing device, a second substrate having transparency, including a via is placed on a solid-state image sensor having a pixel region and a logic region formed in a first substrate and in which a passive component electrically connected with the solid-state image sensor through the via is mounted on the second substrate. Thus, highly efficient location of passive components is attained for miniaturization.

13 Claims, 5 Drawing Sheets

SOLID-STATE IMAGE SENSING DEVICE

CROSS-REFERENCE TO RELATED APPLICATIONS

This application is based upon and claims the benefit of priority from the prior Japanese Patent Application No. 2007-99349 filed on Apr. 5, 2007, the entire contents of which are incorporated herein by reference.

BACKGROUND OF THE INVENTION

1. Field of the Invention

The present invention relates to a solid-state image sensing devices used as, for example, camera modules for a digital still camera, a mobile phone and the like.

2. Description of the Related Art

In recent years, with the miniaturization of digital still cameras and mobile phones, the miniaturization of camera modules installed therein is required.

Generally in a camera module, as disclosed in FIG. 2 and [0029] to [0037] of Japanese Patent Application Laid-Open Publication No. 2005-244118, a solid-state image sensor (sensor chips), such as CCD (Charge Coupled Device) or CMOS (Complementary Metal Oxide semiconductor), and a passive component including a passive element such as a capacitor are mounted on printed circuit boards such as flexible substrates. Further, optical elements such as an optical filter and a lens are mounted on the flexible substrates to constitute a camera module.

In this case, passive components are generally arranged around a solid-state image sensor. Accordingly, the area of the camera module depends upon an area occupied by the passive components. Generally, a plurality of passive components are required for one solid-state image sensor so as to make it work as a solid-state image sensor. Accordingly, it is difficult to miniaturize digital still cameras and mobile phones by reducing of the camera module area since the number of passive components cannot be decreased.

SUMMARY OF THE INVENTION

According to one aspect of the present invention, a solid-state image sensing device includes a solid-state image sensor having a pixel region and a logic region formed in a first substrate, a transparent second substrate having a via disposed over the solid-state image sensor, and further includes a first passive component mounted on the second substrate and electrically connected with the solid-state image sensor through the via.

BRIEF DESCRIPTION OF THE DRAWINGS

The accompanying drawings, which is incorporated in and constitute a part of this specification, illustrates an embodiment of the invention and together with the description, serve to explain the principles of the invention.

DETAILED DESCRIPTION OF THE EMBODIMENTS

Figure 1:
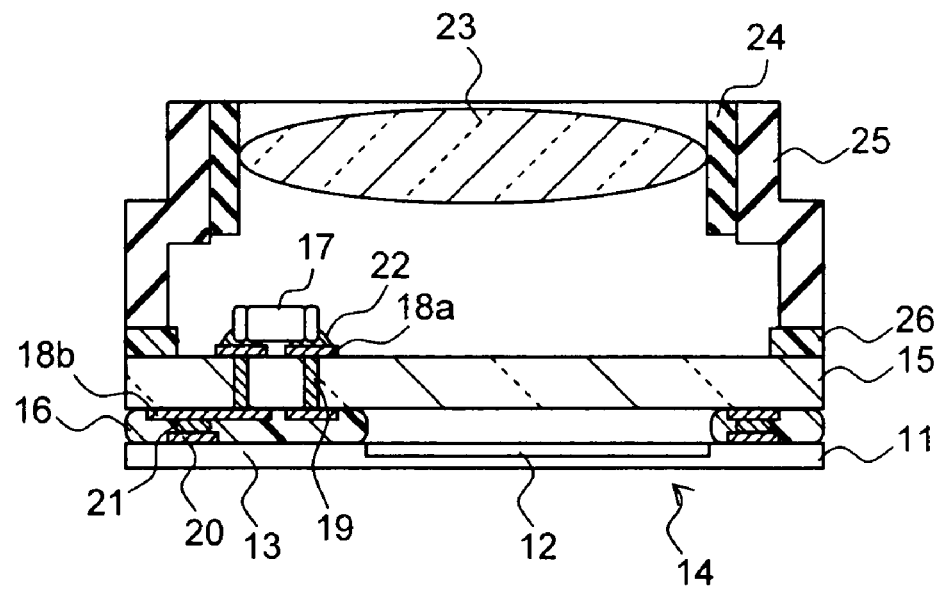
FIG. 1 is a sectional view illustrating a solid-state image sensing device according to one embodiment of the present invention.

Reference will now be made in detail to the present embodiment of the invention, an example of which is illustrated in the accompanying drawing. Wherever possible, the same reference numbers will be used throughout the drawing to refer to the same or like parts.

Embodiments of the present invention will be described with reference to the accompanying drawings.

First Embodiment

FIG. 1 illustrates a sectional view of a camera module as a solid-state image sensing device in the present embodiment. As illustrated, a pixel region 12 and a logic region 13 are formed in a substrate 11 to constitute a solid-state image sensor 14 such as a CCD or CMOS sensor. A substrate 15 having transparency, for example, glass with an IR cut filter formed on a surface thereof, is bonded to the solid-state image sensor 14 with an adhesive agent 16. A passive component 17 is mounted on the substrate 15.

On the substrate 15, conductive patterns (not illustrated) respectively having bonding pads 18a and 18b are formed on a top surface and a bottom surface thereof. The conductive patterns on the top and bottom surfaces are electrically connected through a via 19. The solid-state image sensor 14 is electrically connected with the bonding pad 18b through a bonding pad 20 and a bump 21 formed on the substrate 11. Further, the solid-state image sensor 14 is electrically connected with the passive component 17 through the via 19, the bonding pad 18a and a solder paste 22.

The passive component 17, the via 19, and the conductive pattern including and the boding pads 18a and 18b are disposed over a region except the pixel region 12 of the solid-state image sensor 14, for example, over the logic region 13. There are disposed optical elements such as an optical lens 23 and, a lens barrel 24 and a lens holder 25 for retaining the optical lens. The camera module is thus constituted.

Figure 2A:
FIG. 2A is a sectional view illustrating a transparent substrate according to one embodiment of the present invention.
Figure 2B:
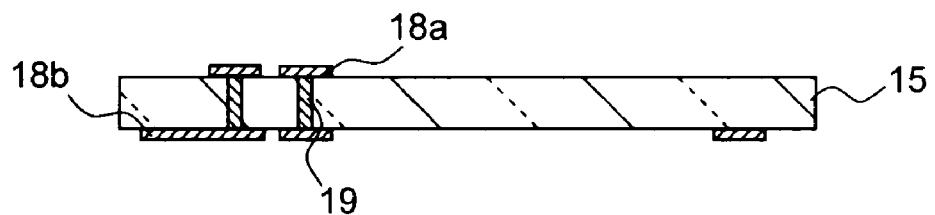
FIGS. 2B to 2E are sectional views illustrating a process for manufacturing a solid-state image sensing device according to one embodiment of the present invention.

Such a solid-state image sensing device is structured as described below, as an example. The substrate 15 having transparency, for example, made of glass with an IR cut filter 15a formed on a surface thereof, as illustrated in FIG. 2A is used. In the substrate 15, via holes are formed and inside of the via holes and predetermined regions on the top surface and the bottom surface of the substrate 15 are metallized so as to form a conductive pattern including the bonding pads 18a and 18b the via 19.

Figure 2C:
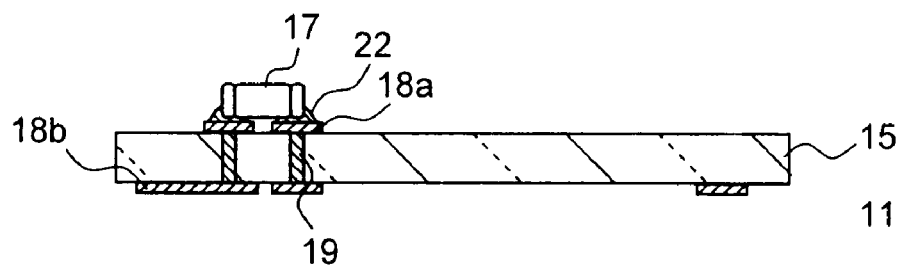
Figure 2D:
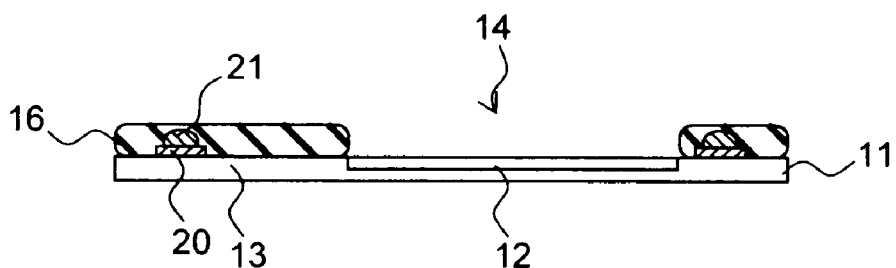

Solder paste 22 is printed on the bonding pad 18a as illustrated in FIG. 2C. On the solder paste 22, the passive component 17 is placed for connection.

On the other hand, the pixel region 12 and the logic region 13 are formed on the substrate 11. After that, the bonding pad 20 is formed on the logic region 13 and then the bump 21 is formed on the bonding pad 20. The adhesive agent 16 made of ultraviolet curing resin, thermosetting resin or the like for bonding to the substrate 15 is applied.

Figure 2E:
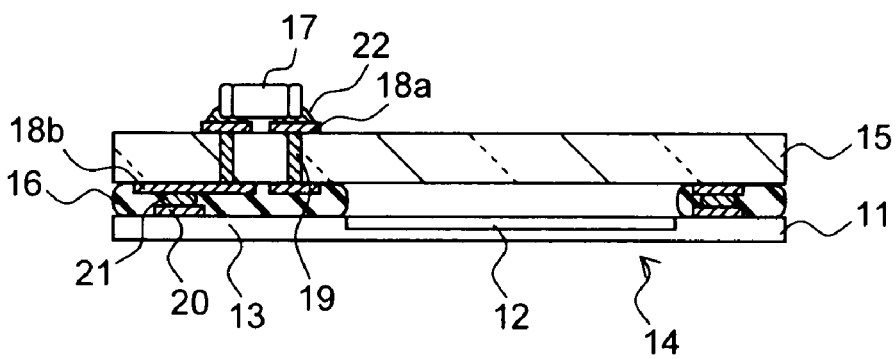

As illustrated in FIG. 2E, the substrate 11 and the substrate 15 are bonded to each other such that the bump 21 and the bonding pad 18b are electrically connected with each other and the passive component 17 is located over the logic region 13. Further, optical elements such as the optical lens 23 and, the lens barrel 24 and the lens holder 25 for retaining the optical lens 23 are fixed using an adhesive agent 26 or the like to constitute a camera module as illustrated in FIG. 1.

In the solid-state image sensing device according to the present embodiment, a passive component is disposed over the logic region, that is, over a region except a pixel region. This allows the passive component to be three-dimensionally arranged without affecting a light receiving path. By using a transparent substrate as the substrate, on which the passive component is placed, the substrate can be disposed over a solid-state image sensor. Further, the transparent substrate can function as a filter by forming IR cut filter.

Accordingly, such a configuration allows a passive component to be effectively disposed, whereby miniaturizing a solid-state image sensing device becomes possible.

Second Embodiment

Figure 3:
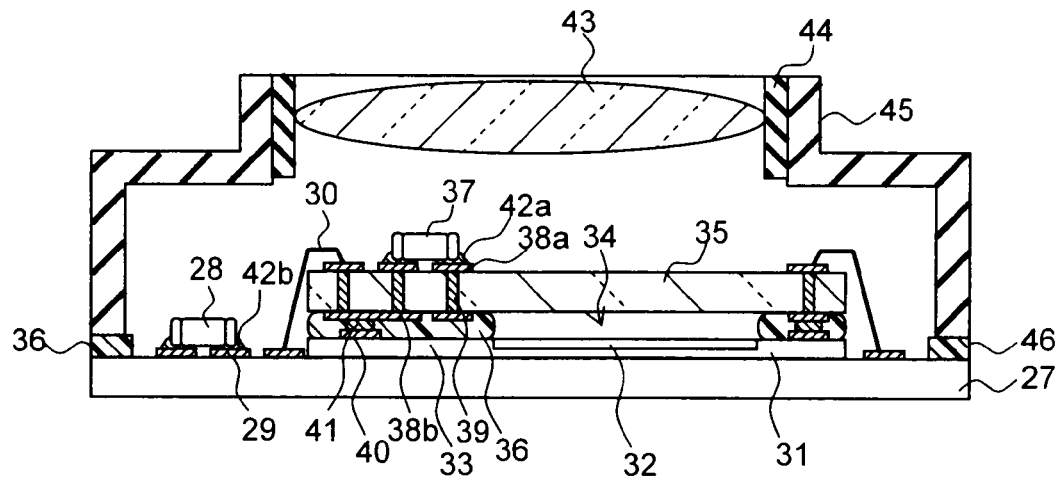
FIG. 3 is a sectional view of a solid-state image sensing device according to another embodiment of the present invention.

FIG. 3 illustrates a sectional view of a camera module as a solid-state image sensing device according to the present embodiment. As illustrated, there is disposed a solid-state image sensor 34 in which a passive component 28 is formed on a substrate 27, and a solid-state image sensor 34 having a pixel region 32 and a logic region 33 is formed in a substrate 31. A substrate 35 having transparency made of glass or the like is bonded onto the substrate 31 with an adhesive agent 36 in the same way as for the first embodiment.

On the substrate 27, a conductive pattern (not illustrated) including a bonding pad 29 on a surface thereof is formed. On a substrate 35, conductive patterns (not illustrated) including bonding pads 38a, 38b are formed on a top surface and a bottom surface thereof respectively, in the same way as for the first embodiment. Further, the bonding pad 29 is connected with the bonding pad 38a by a wire 30.

Conductive patterns on the top surface and the bottom surfaces are electrically connected with each other through a via 39 in the same way as for the first embodiment. The solid-state image sensor 34 is electrically connected with the bonding pad 38b through a bump 41 at a bonding pad 40 formed on the substrate 31. The solid-state image sensor 34 is electrically connected with passive components 28 and 37, through the via 39, the bonding pad 38a and solder pastes 42a and 42b respectively.

The passive part 37, the via 39 and the conductive patterns including the bonding pads 38a and 38b are disposed over a region except the pixel region 32 of the solid-state image sensor 34, for example, over the logic region 33.

Optical elements such as an optical lens 43 and, a lens barrel 44 and a lens holder 45 for retaining the optical lens are placed so as to include the passive component 28 and the substrate 31 inside thereof. The camera module is thus constituted.

Figure 4A:
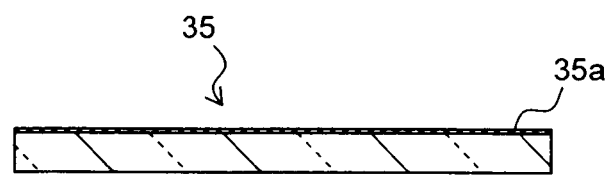
FIG. 4A is a sectional view illustrating a transparent substrate according to another embodiment of the present invention.
Figure 4B:
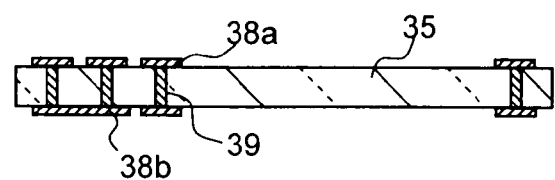
FIGS. 4B to 4E are sectional views illustrating a process for manufacturing a solid-state image sensing device according to another embodiment of the present invention.
Figure 4C:
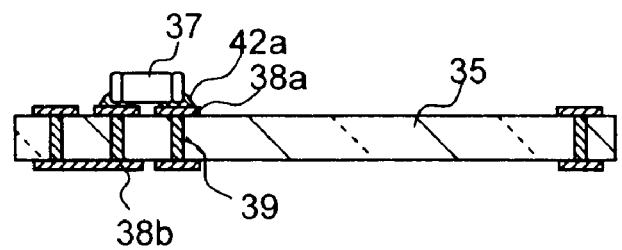
Figure 4D:
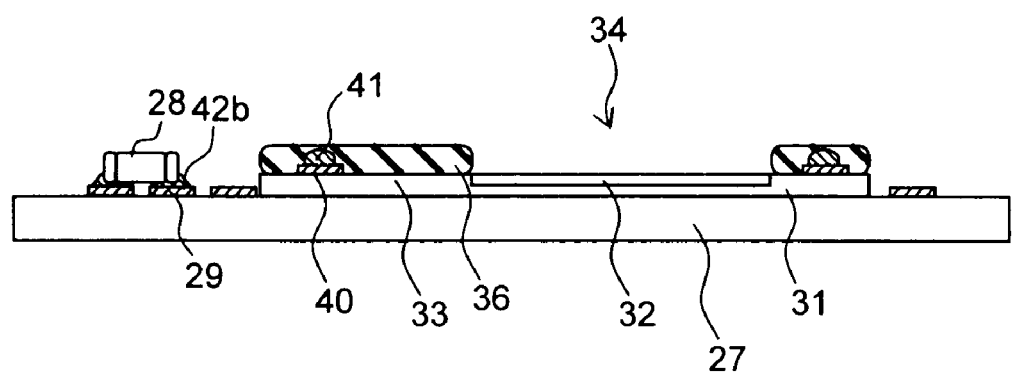

Such a solid-state image sensing device is structured as described below, as an example. In the same way for the first embodiment, the substrate 35 having transparency, for example, made of glass with an IR cut filter 35a formed on a surface thereof, as illustrated in FIG. 4A is used. In the substrate 35, via holes are formed as well as a conductive pattern including the bonding pads Solder paste 42a is printed on the bonding pad 38a as illustrated in FIG. 4C, in the same way as for the first embodiment. The passive component 37 is placed on the solder paste 42a for connection.

On the other hand, a conductive pattern including the bonding pad 29 is formed on the substrate 27, and the solder paste 42b is printed on the bonding pad 29. The passive component 28 is placed on the solder paste 42b for connection. The solid-state image sensor 34, in which the pixel region 32, the logic region 33 and the bonding pad 39 are formed on the substrate 31, is mounted on the substrate 27. The bump 41 is formed on the bonding pad 39 and the adhesive agent 36 for bonding to the substrate 35 is applied.

Figure 4E:
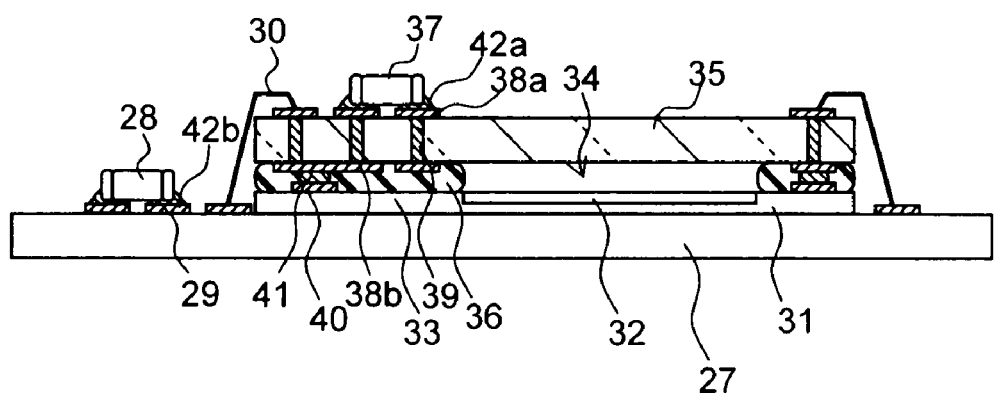

As illustrated in FIG. 4E, the substrate 31 and the substrate 35 are bonded to each other such that the bump 41 and the bonding pad 38b are electrically connected with each other and the passive component 37 is located over the logic region 33. The bonding pad 29 and the bonding pad 38a are connected by the wire 30. Optical elements such as the optical lens 43 and, the lens barrel 44 and the lens holder 45 for retaining the optical lens 43 are fixed using an adhesive agent 46 or the like to constitute a camera module as illustrated in FIG. 3.

In the solid-state image sensing device according to the present embodiment, a passive component is mounted on a substrate, on which a solid-state sensor is also placed, similarly to a conventional one, and some of the passive components are disposed over a logic region, that is, over a region except a pixel region. This allows passive components to be three-dimensionally arranged without a part of the passive components affecting a light-receiving path. In addition, by using a transparent substrate as a substrate, on which some of passive components are placed, the substrate can be placed over a solid-state image sensor without a need of forming an opening in the substrate. Furthermore, the transparent substrate can function as a filter by forming IR cut filter.

Accordingly, such a configuration allows passive components to be effectively arranged without limiting the number of the passive components, whereby the number of passive components located around a solid-state image sensor can be reduced, thus miniaturizing a solid-state image sensing device becomes possible.

Figure 5:
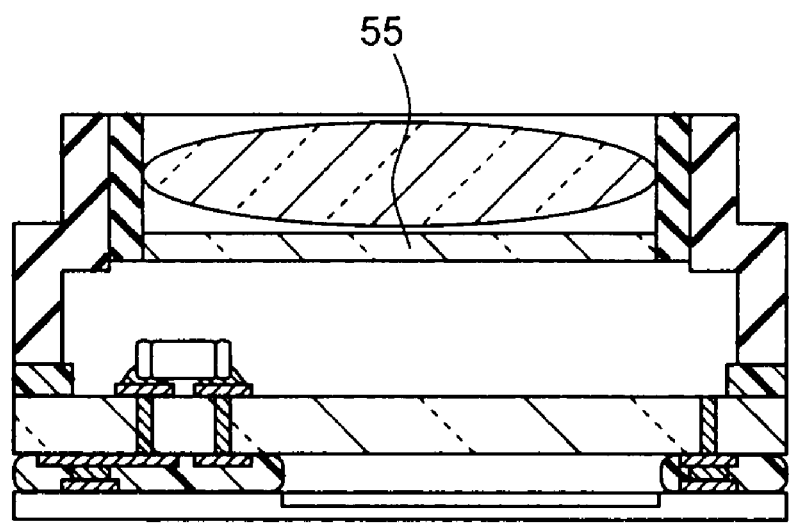
FIG. 5 is a sectional view of a solid-state image sensing device according to another embodiment of the present invention.

In the above-described embodiment, glass, on which an IR cut filter is formed, is used as a substrate, on which a local passive component is placed. However, the substrate, on which a local passive component may be any substrate having transparency even without an IR cut filter. In this case, as illustrated in FIG. 5, glass 55 with an IR cut filter may be additionally provided.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A camera module comprising:
   a solid-state image sensor having a pixel region and a logic region;
   a first substrate having transparency, placed over the solid-state image sensor, and having a via located over the logic region;
   a first passive component mounted on the first substrate over the logic region and the first passive component electrically connected with the solid-state image sensor through the via;

an optical lens disposed over the first substrate and the optical lens separated from the first substrate; and a lens holder mounted on the first substrate, the lens holder configured to retain the optical lens.

2. The camera module according to claim 1, wherein at least a part of the lens holder is disposed on the first substrate over the logic region.

3. The camera module according to claim 1, wherein the via is electrically connected with the solid-state image sensor through a bump.

4. The camera module according to claim 1, wherein the first substrate has a first conductive pattern formed on a top surface of the first substrate and a second conductive pattern formed on a bottom surface of the first substrate.

5. The camera module according to claim 4, wherein the first conductive pattern and the second conductive pattern are connected through the via.

6. The camera module according to claim 4, wherein the second conductive pattern is electrically connected with the solid-state image sensor through a bump.

7. The camera module according to claim 4, wherein the first conductive pattern and the second conductive pattern are located over the logic region.

8. The camera module according to claim 1, wherein the solid-state image sensor and the first substrate are bonded with adhesive agent.

9. The camera module according to claim 8, wherein the adhesive agent contains ultraviolet curing resin or thermosetting resin.

10. The camera module according to claim 1, wherein the first substrate has an IR cut filter.

11. The camera module according to claim 1, further comprising glass with an IR cut filter disposed over the first substrate.

12. The camera module according to claim 1, further comprising an optical lens disposed over the first substrate.

13. The camera module according to claim 1, wherein the solid-state image sensor is a CCD or CMOS sensor.

* * * * *